(12) United States Patent
Kondo et al.

(10) Patent No.: US 6,414,343 B1
(45) Date of Patent: Jul. 2, 2002

(54) SOLID-STATE IMAGING DEVICE HAVING ASPHERIC LENSES

(75) Inventors: Ryuji Kondo; Kazuyuki Masukane, both of Kurokawa-gun (JP)

(73) Assignee: Fuji Photo Film., Ltd., Kanagawa (JP)

( * ) Notice: Subject to any disclaimer, the term of this patent is extended or adjusted under 35 U.S.C. 154(b) by 0 days.

(21) Appl. No.: 09/676,769

(22) Filed: Oct. 2, 2000

(30) Foreign Application Priority Data

Oct. 7, 1999 (JP) ............................................ 11-287336

(51) Int. Cl.[7] ..................... H01L 31/062; H01L 31/113
(52) U.S. Cl. ........................... 257/294; 257/291; 438/48
(58) Field of Search ................................ 257/294, 231, 257/233, 291, 432, 435, 290, 292, 293, 431, 424, 436, 440; 438/48

(56) References Cited

U.S. PATENT DOCUMENTS

| | | | |
|---|---|---|---|
| 5,451,766 A | * | 9/1995 | Van Berkel ............... 250/208.1 |
| 6,060,732 A | * | 5/2000 | Murakami et al. ........... 257/215 |
| 6,069,350 A | * | 5/2000 | Ohtsuka et al. ............. 257/294 |
| 6,274,516 B1 | * | 8/2001 | Kamei et al. ............... 438/782 |
| 6,295,107 B1 | * | 9/2001 | Watanabe et al. ............. 349/95 |
| 6,297,911 B1 | * | 10/2001 | Nishikawa et al. .......... 359/619 |

* cited by examiner

*Primary Examiner*—David Nelms
*Assistant Examiner*—Andy Huynh
(74) *Attorney, Agent, or Firm*—Arent Fox Kintner Plotkin & Kahn, PLLC

(57) ABSTRACT

A solid-state imaging device comprises: a semiconductor substrate which demarcates a two-dimensional surface; a multiplicity of photoelectric conversion units configured in a multiplicity of rows and columns on the surface of said semiconductor substrate; a light shielding film having openings formed above said semiconductor substrate, each of the openings is formed on each of said photoelectric conversion unit; a planarizing insulating film formed on said light shielding film; micro lenses formed on said planarizing insulating film, each micro lens is formed just above each of said opening; and a modifying film having one layer or a plurality of layers formed directly on said micro lenses and having a top surface with different curvature from that of a top surface of the micro lenses.

8 Claims, 10 Drawing Sheets

SOLID-STATE IMAGING DEVICE HAVING ASPHERIC LENSES

This application is based on Japanese Patent Application HEI 11-287336, filed on Oct. 7, 1999, the entire contents of which are incorporated herein by reference.

BACKGROUND OF THE INVENTION a) Field of the Invention

This invention relates to a shape and a structure of an on-chip micro-lens formed in a solid-state imaging device in order to input light efficiently.

b) Description of the Related Art

In a solid-state imaging device having a multiplicity of photoelectric conversion units formed on a semi-conductor substrate in a matrix shape, a light shielding film is formed on the substrate. The light shielding film has openings, each of which corresponds to each of the photoelectric conversion units formed on the substrate. A micro-lens is formed just above each opening of the light shielding film to increase the efficiency of the light concentration.

FIG. 6 are enlarged cross sectional views of a part of the solid-state imaging device according to the prior art.

Photoelectric conversion units 2 and transfer channels 3 are formed on a semi-conductor substrate 1 made of silicon. A partition region 4 is formed next to each transfer channel 3. After that, an upper surface of the semi-conductor substrate 1 having the photoelectric conversion units 2, the transfer channels 3 and the partition regions 4 are oxidized to form an insulating film 5 made of silicon oxide or the like.

Next, a transfer electrode is formed above each transfer channel 3, and an insulating film 5a is formed on the substrate 1 covering the transfer electrodes 5a. A light shielding film 7 having openings is formed on the insulating film 5a to shade the transfer electrodes 5a. Each opening of the light shielding film 7 is formed just above each photoelectric conversion unit 2.

On the light shielding film 7, a focus adjusting layer 8 including a passivation layer, and then a color filter layer 9 is formed thereon.

A planarizing layer 10 is formed on the color filter layer 9, and thereon a lens layer 11 made of transparent resin is formed by the spin-coat. The lens layer 11 is patterned by the photolithography to make a shape shown in FIG. 6A.

Then, to make the patterned lens layers 11 into microlenses 11, each having a shape shown in FIG. 6B, by flowing with heating process at a temperature beyond a softening temperature of the transparent resin used for forming the lens layers 11.

A commonly used imaging sensor for camcorders and digital still cameras has over one million pixels. In this kind of multi-pixel imaging sensor, a size of an on-chip micro lens is less than about five micrometers around, and is getting nearly three micrometers around. The size of that kind of imaging sensor is less than a quarter of a size of an old imaging sensor.

As a pixel gets smaller, an on-chip micro lens gets smaller, too. Shrinking of the on-chip micro lens makes a radius of curvature short. Therefore, it will make a focal length short. Also, the small on-chip micro lens faces a problem of focal length that a focal length near the edges of the on-chip micro lens is shorter than that of the axis of the on-chip micro lens.

For example, a lens for a conventional camera is made into an aspheric lens so as to solve the problem of focal length. Therefore, it is preferable to make an on-chip micro lens used for a solid-state imaging device into an aspheric lens. However, it is very difficult to form an aspheric lens as an on-chip micro lens according to a prior manufacturing method.

SUMMARY OF THE INVENTION

It is an object of the present invention to provide a solid-state imaging device, wherein a micro lens can gather light onto a photoelectric conversion unit, manufactured without a complex step such as forming an inner lens.

It is another object of the present invention to provide a solid-state imaging device that can effectively lead incident light onto a pixel.

According to one aspect of the present invention, there is provided a solid-state imaging device comprising: a semiconductor substrate which demarcates a two-dimensional surface; a multiplicity of photoelectric conversion units configured in a multiplicity of rows and columns on the surface of said semiconductor substrate; a light shielding film having openings formed above said semiconductor substrate, each of the openings is formed on each of said photoelectric conversion unit; a planarizing insulating film formed on said light shielding film; micro lenses formed on said planarizing insulating film, each micro lens is formed just above each of said opening; and a modifying film having one layer or a plurality of layers formed directly on said micro lenses and having a top surface with different curvature from that of a top surface of the micro lenses.

According to another aspect of the present invention, there is provided a method of manufacturing a solid-state imaging device comprising the steps of: (a) forming a multiplicity of photoelectric conversion units configured in a multiplicity of rows and columns on a surface of a semiconductor substrate which demarcates a twodimensional surface; (b) forming a light shielding film having openings, each of which is formed on each of said photoelectric conversion unit, above said semiconductor substrate; (c) forming a planarizing insulating film on said light shielding film; (d) forming micro lenses, each of which is formed just above each of said opening, on said planarizing insulating film; (e) forming a modifying film having one layer or a plurality of layers on said micro lenses; and (f) curing said film having one layer or a plurality of layers formed at said step (e) by heating.

According to another aspect of the present invention, there is provided a method of manufacturing a solid-state imaging device comprising the steps of: (a) forming a multiplicity of photoelectric conversion units configured in a multiplicity of rows and columns on a surface of a semiconductor substrate which demarcates a twodimensional surface; (b) forming a light shielding film having openings, each of which is formed on each of said photoelectric conversion unit, above said semiconductor substrate; (c) forming a planarizing insulating film on said light shielding film; (d) forming color filters in a plurality of colors on said planarizing insulating layer; (e) forming micro lenses, each of which is formed just above each of said openings, on said color filters; (f) forming a modifying film having one layer or a plurality of layers on said micro lenses; (g) removing part of said modifying film according to colors of said color filters by patterning; and (h) curing said modifying film formed at said steps (f) and (g) by heating.

DETAILED DESCRIPTION OF THE PREFERRED EMBODIMENTS

Figure 1A:
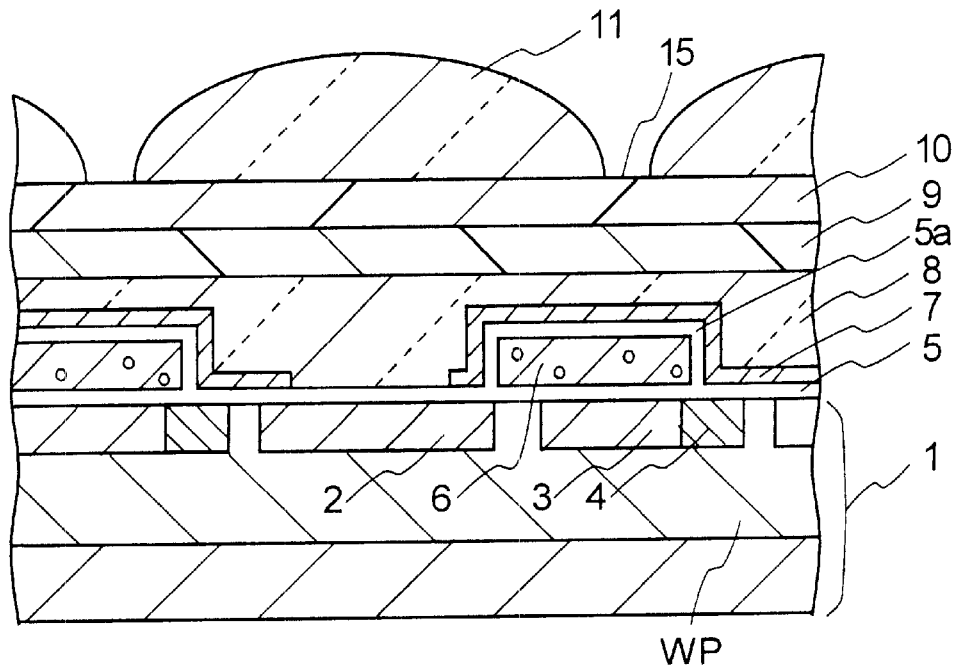
FIGS. 1A–1B are enlarged cross sectional views of a part of the solid-state imaging device according to a first embodiment of the invention.
Figure 1B:
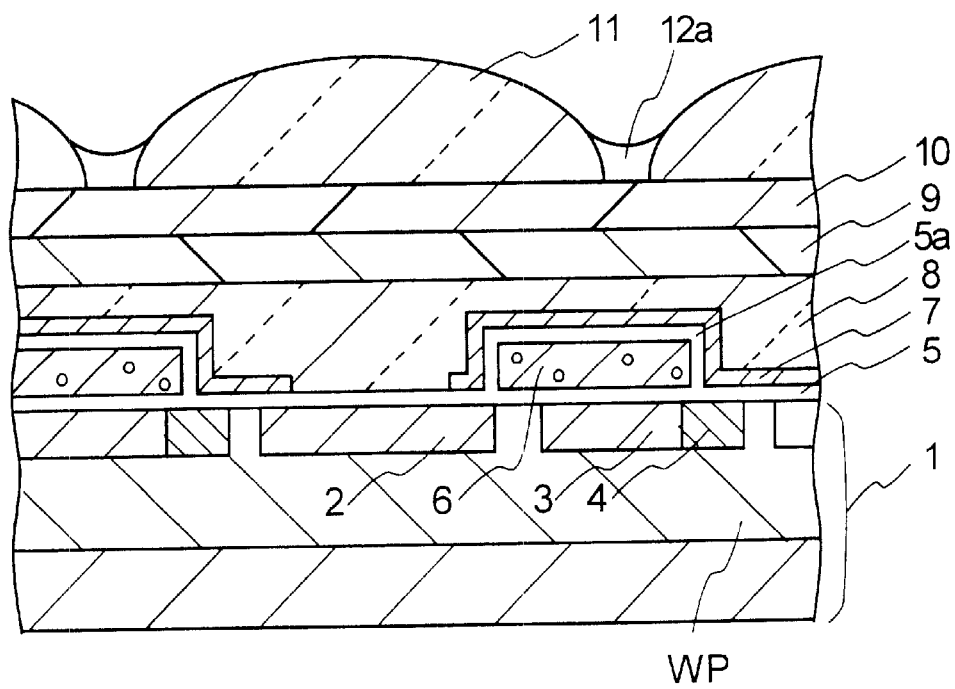
Figure 6A:
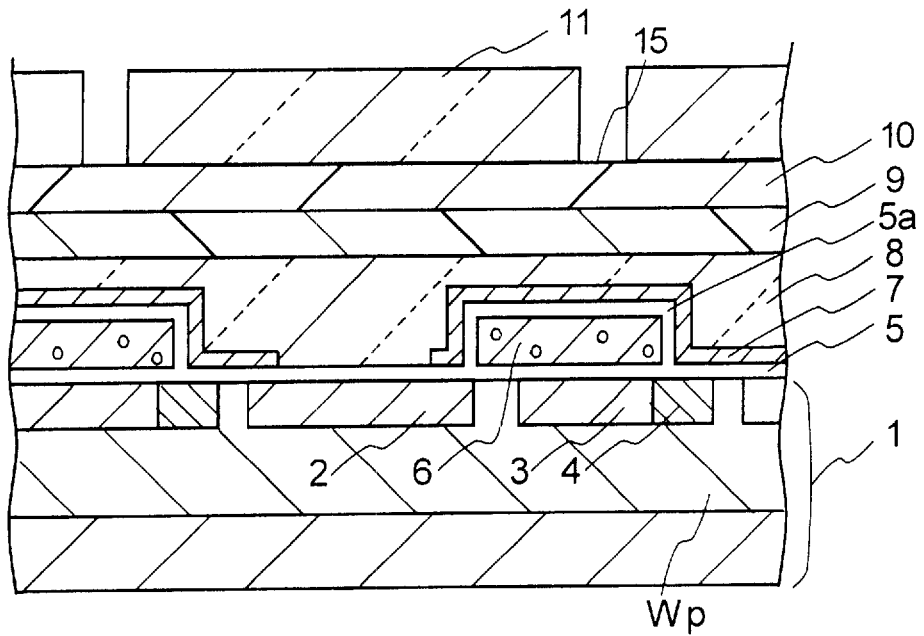
FIGS. 6A–6B are enlarged cross sectional views of a part of the solid-state imaging device according to the prior art.
Figure 6B:
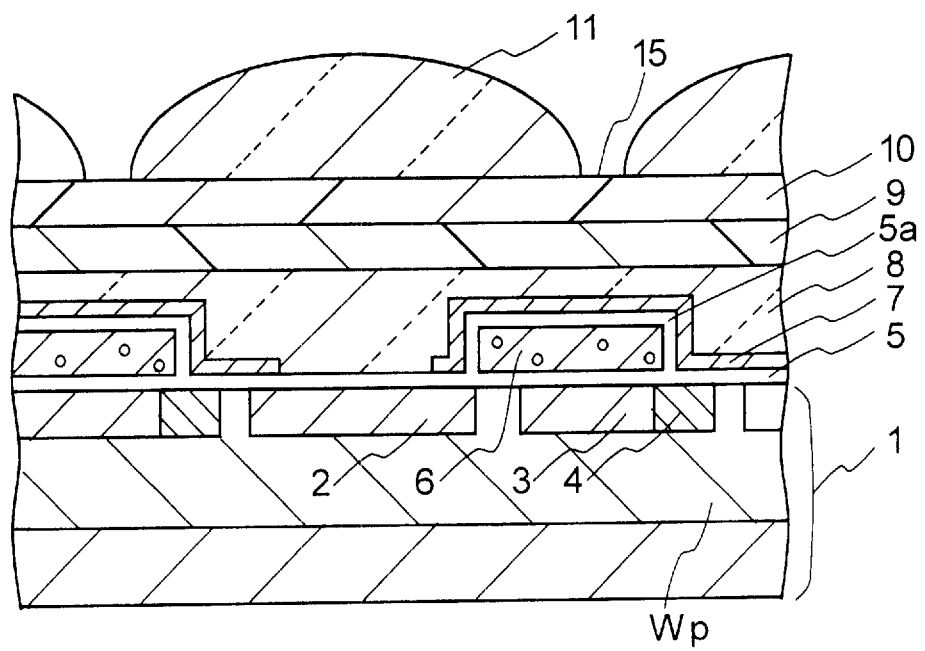

FIGS. 1A and 1B are enlarged cross sectional views of a part of the solid-state imaging device according to a first embodiment of the invention. In the drawings, parts with the same reference numbers as in FIGS. 6A–6B are basically same parts as in FIG. 1A.

A semiconductor substrate 1 is made of n-type silicon or the like and has p-type well WP. On a surface of the semiconductor substrate 1 formed, for example, photoelectric conversion units 2 having p-n connecting structure and transfer channels 3 of n-type region. A partition region 4 of p+–type region is formed next to each transfer channel 3. The surface of the semiconductor substrate 1 is oxidized after forming the photoelectric conversion units 2, the transfer channels 3 and the partition regions 4, and then an insulating film 5 made of silicon oxide or the like is formed.

Next, on the transfer channels 3, transfer electrodes 6 made of double-layered polycrystalline silicon layer or the like, and an insulating film 5a is formed thereon. After that, a light shielding film 7 having an opening above each of the photoelectric conversion units 2 is formed above the transfer electrodes 6. The light shielding film 7 is made of aluminum or the like.

After forming the light shielding film 7, thereon formed a focus-adjusting layer 8 including a passivation layer and a planarizing insulating layer. On the focus-adjusting layer 8, a color filter layer 9 consisting of color filters in three colors: R (red), G (green), and B (blue). On the color filter layer 9, a planarizing layer 10 made of transparent insulator such as photo resist or the like is formed by spin-coat or the like to planarize the surface.

Next, micro lenses 11 are formed on the planarizing layer 10. The micro lenses 11 are made of a photo resist film whose softening temperature is about 200 degree Celsius. The formed micro lenses have average thickness of about 1 micrometer. At this point, a shape of the micro lenses 11 are like that shown in FIG. 1B.

On the micro lenses 11 formed an asphericating film 12a made of a photo resist film whose softening temperature is about 200 degrees Celsius and an average thickness is about 0.2 micrometer. The asphericating film 12a is formed by applying photo resist liquid to the surfaces of the micro lenses 11 and spaces 15 between micro lenses.

The thickness (FT) of the asphericating film 12a preferably satisfies a relationship $FT \leq h\ (a1L2+a2L1)/(a1+L1)(a2+L2)$ where, h is a height of said micro lens, a1 is a width of said opening, a2 is a depth of said opening, L1 is a length of a gap between transversely adjacent openings, and L2 is a length of a gap between longitudinally adjacent openings.

By satisfying the relationship, the height of the asphericating film 12a will not be higher than that of the micro lenses 11. Therefore, a combination of the micro lens 11 and the asphericating film 12a can maintain the shape of an aspheric lens.

The photo-resist liquid applied to the surfaces has wettability to the surface of the micro lenses 11 and small viscosity. The viscosity of the asphericating film 12a may be smaller than that of the micro lenses 11. When the photo resist liquid is applied, the surfaces of spaces 15 are filled with higher priority over the surfaces of the micro lenses 11. After the application, the photo-resist liquid is post-baked at a temperature below the softening temperature of the photo resist liquid to for the asphericating film 12a.

Applying photo-resist liquid having small viscosity to an inclined surface, a film thickness of the asphericating film 12a will not be uniformed. The thickness of the asphericating film 12a is getting thicker from an axis of the micro lens 11 to a rim of micro lens 11, therefore the rim of the aspheric lens formed with a combination of the micro lens 11 and the asphericating film 12a has longer effective focal length than an axis of the aspheric lens has. In this embodiment, the asphericating film 12a is made of photo-resist liquid having small viscosity; therefore the shape of the asphericating film 12a becomes a shape shown in FIG. 1B. Also, the asphericating film 12a cooperates with each of the micro lenses to make an aspheric lens.

On the other hand, applying highly viscous photo-resist liquid can form a film having a uniformed thickness over whole surface of each micro lens 11. Heating process over the softening temperature of the film can fluidize the film so as to reflow the film to lower part (rim of the micro lenses 11). The viscosity can be controlled, for example, by adjusting an amount of thinner added to the photo-resist liquid. Larger amount of thinner makes less viscous photo-resist liquid.

The asphericating film 12a may be made not only of photo-resist film but also of either one of organic material or non-organic material. A ultra-violet curing resin may also be used for forming the asphericating film 12a. Further, the asphericating film 12a may be formed not only by applying but also by blowing or soaking.

By making an on-chip micro lens into an aspheric lens, an incident light can efficiently led to the pixel. Therefore, sensitivity of the solid-state imaging device can be improved. Also smear of the solid-state imaging device can be reduced.

Figure 2A:
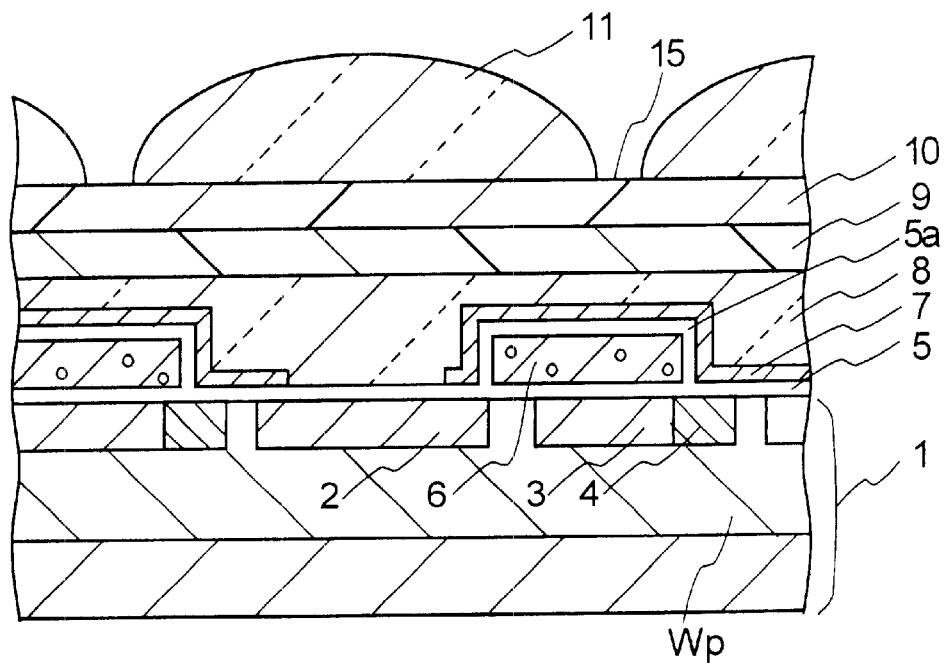
FIGS. 2A–2C are enlarged cross sectional views of a part of the solid-state imaging device according to a second embodiment of the invention.
Figure 2B:
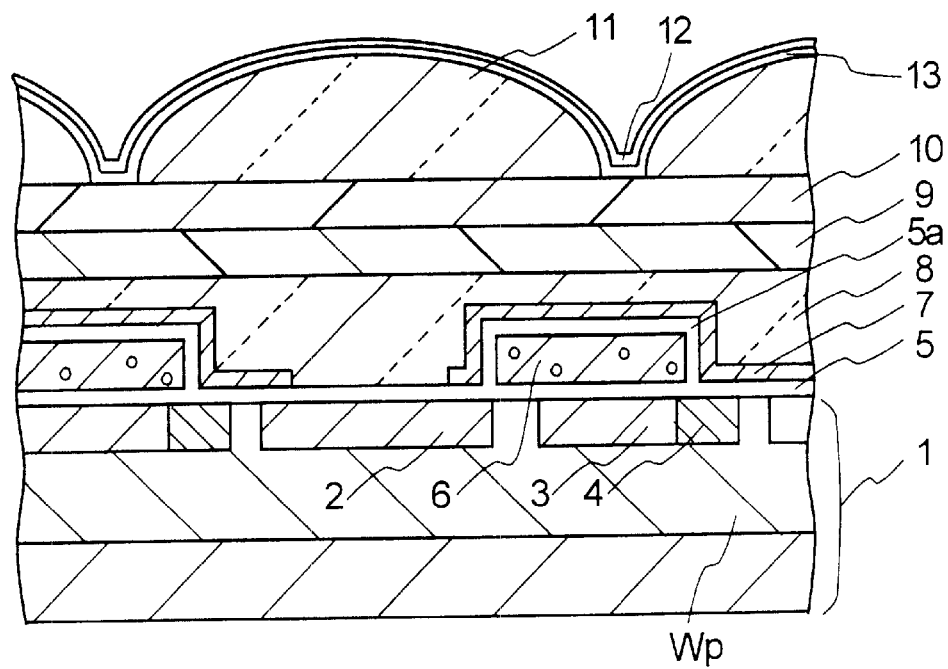
Figure 2C:
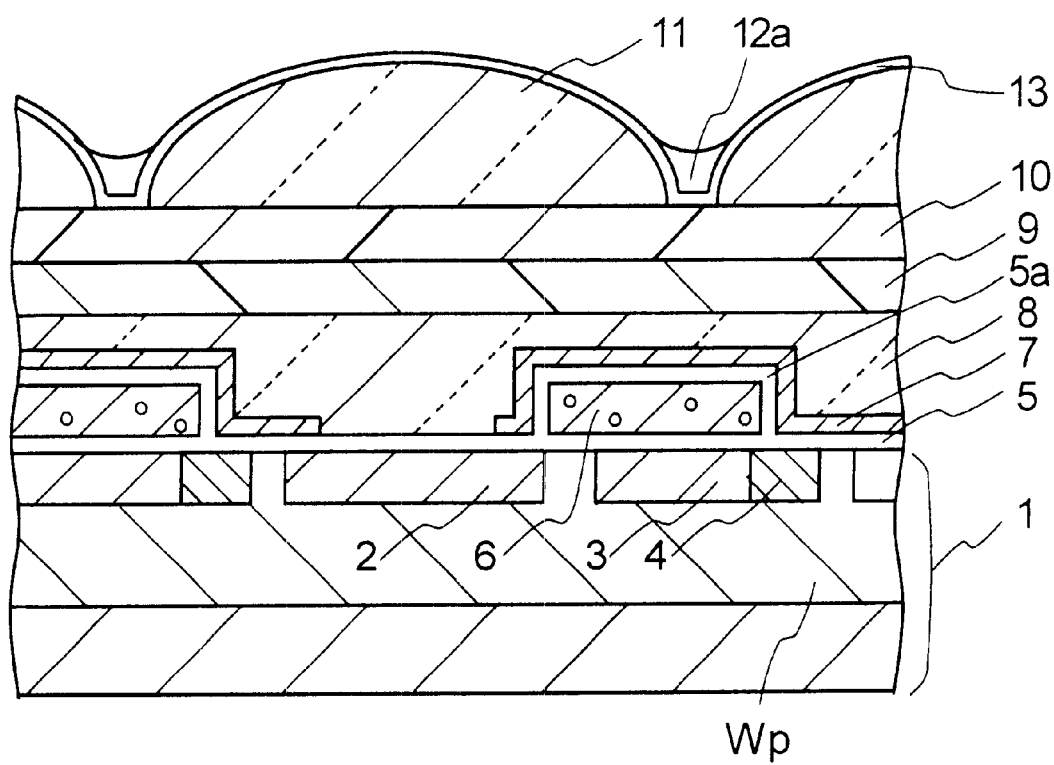

FIGS. 2A to 2C are enlarged cross sectional views of a part of the solid-state imaging device according to a second embodiment of the invention. In the drawings, parts with the same reference numbers as in FIG. 6 and FIG. 1 are basically same parts as in FIG. 6 and FIG. 1.

By the same method as in the above described first embodiment, on a substrate 1 are formed photoelectric conversion units 2, transfer channels 3, partition regions 4, insulating films 5, transfer electrodes 6, a light shielding film 7, a focus-adjusting layer 8, a color filter layer 9, and a planarizing layer 10.

Next, micro lenses 11 are formed on the planarizing layer 10. The micro lenses 11 are made of a photo resist film whose softening temperature is about 250 degree Celsius. The formed micro lenses have an average thickness of about 1 micrometer. At this point, a shape of the micro lenses 11 are like that shown in FIG. 2B.

On the micro lenses 11 is formed, by vapor phase reaction, evaporating or the like, a wettability improving film 13 made of a metal film which has an average thickness of about 10 nanometer as shown in FIG. 2B. The metal film used for forming the wettability improving film 13 is effective for uniformalizing conditions of the surfaces of the micro lenses 11 and the space 15 between the micro lenses 11.

This wettability improving film 13 can be made not only of a metal film but also of either one of organic material or non-organic material. Material used for the wettability improving film 13 should be formed to be thin enough not to affect optical characteristics of the micro lenses 11, and should be highly coherent with the micro lenses 11.

On the wettability improving film 13 formed an asphericating film 12a made of a photo resist film whose softening temperature is about 200 degrees Celsius and an average thickness is about 0.2 micrometer. The asphericating film 12a is formed by applying photo resist liquid to the surfaces of the wettability improving film 13.

In this embodiment, highly viscous photo-resist liquid is used for forming the asphericating film 12a having a uniformed thickness. Heating process at over the softening temperature of the film can fluidize the film so as to reflow the film to lower part (rim of the micro lenses 11). In this embodiment, the heating process is performed at over 200 degrees Celsius to fluidize the film formed on the wettability improving film 13, and the asphericating film 12a will be shaped as in FIG. 2C.

In addition to make an on-chip micro lens into an aspheric lens, a wettability improvement film 13 is formed; therefore, the micro lens can be protected, and effectiveness of the heating process performed to the asphericating film 12a will be unformed.

The asphericating film 12a may be made not only of photo-resist film but also of either one of organic material or non-organic material. A ultra-violet curing resin may also be used for forming the asphericating film 12a. Further, the asphericating film 12a may be formed not only by applying but also by blowing or soaking.

FIGS. 3A to 3D are enlarged cross sectional views of a part of the solid-state imaging device according to a third embodiment of the invention. In the drawings, parts with the same reference numbers as in FIG. 6, FIG. 1 and FIG. 2 are basically same parts as in FIG. 6, FIG. 1 and FIG. 2.

By the same method as in the above described embodiments, on a substrate 1 are formed photoelectric conversion units 2, transfer channels 3, partition regions 4, insulating films 5, transfer electrodes 6, a light shielding film 7, a focus-adjusting layer 8, a color filter layer 9, and a planarizing layer 10.

Next, micro lenses 11 are formed on the planarizing layer 10. The micro lenses 11 are made of a photo resist film whose softening temperature is about 300 degree Celsius. The formed micro lenses have an average thickness of about 1 micrometer. At this point, a shape of the micro lenses 11 are like that shown in FIG. 3A.

On the micro lenses 11 is formed, by vapor phase reaction, evaporating or the like, a wettability improving film 13 made of a metal film which has an average thickness of about 10 nanometer as shown in FIG. 2B. The metal film used for forming the wettability improving film 13 is effective for uniformalizing conditions of the surfaces of the micro lenses 11 and the space 15 between the micro lenses 11.

This wettability improving film 13 can be made not only of a metal film but also of either one of organic material or non-organic material. Material used for the wettability improving film 13 should be formed to be thin enough not to affect optical characteristics of the micro lenses 11, and should be highly coherent with the micro lenses 11.

Figure 3A:
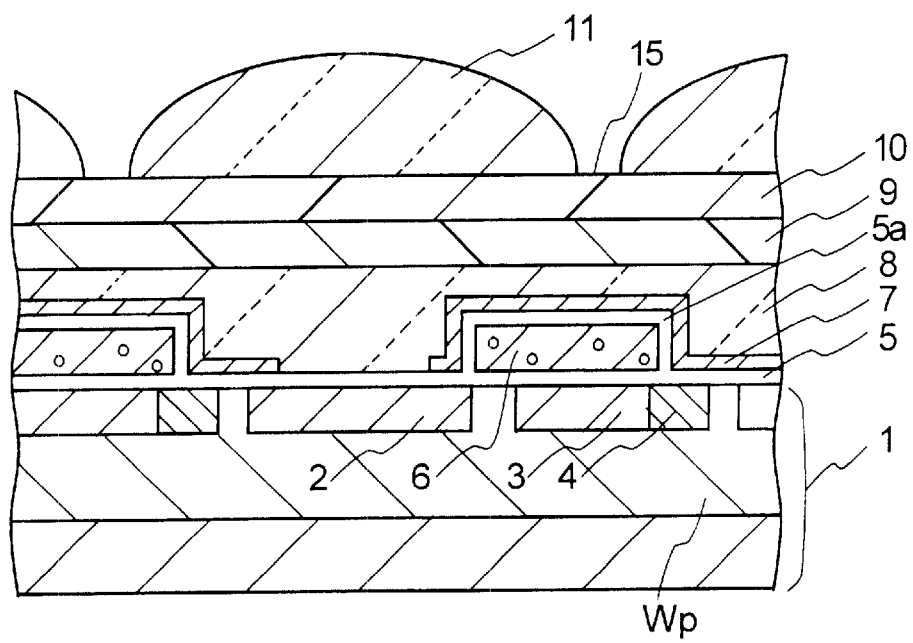
FIGS. 3A–3E are enlarged cross sectional views of a part of the solid-state imaging device according to a third embodiment of the invention.
Figure 3B:
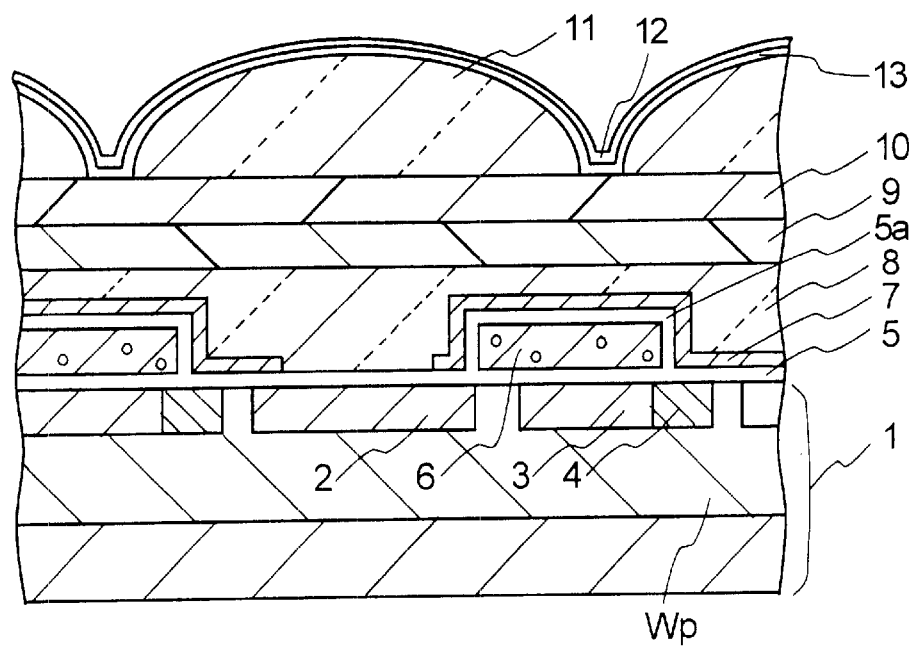

On the wettability improving film 13 formed a first asphericating film 12a made of a photo resist film whose softening temperature is about 250 degrees Celsius and an average thickness is about 0.1 micrometer as shown in FIG. 3B. The first asphericating film 12a is formed by applying photo resist liquid to the surfaces of the wettability improving film 13. In this embodiment, the heating process is performed at over 250 degrees Celsius to fluidize the film formed on the wettability improving film 13, and the first asphericating film 12a will be shaped as in FIG. 3C.

Figure 3C:
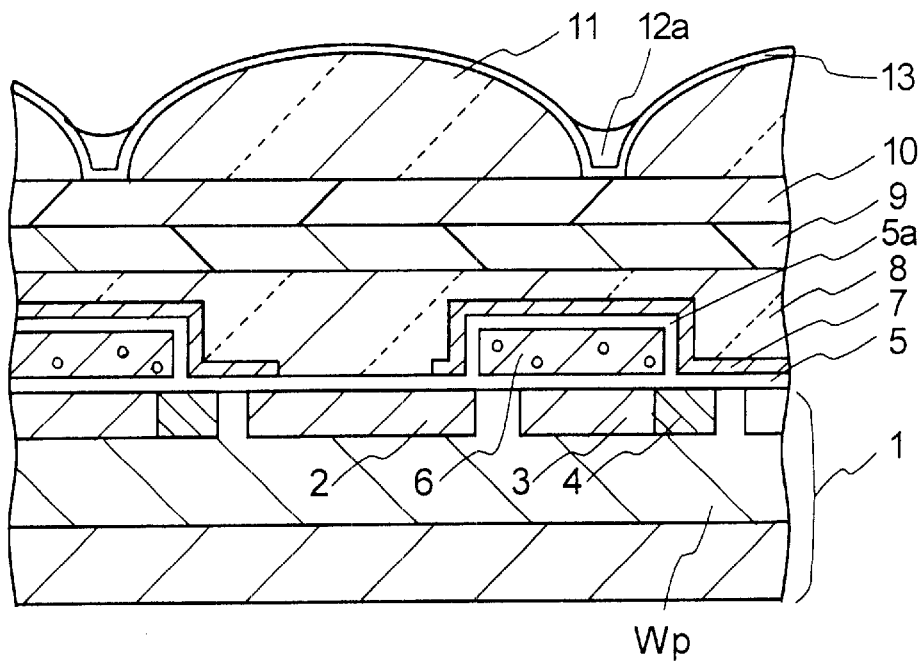
Figure 3D:
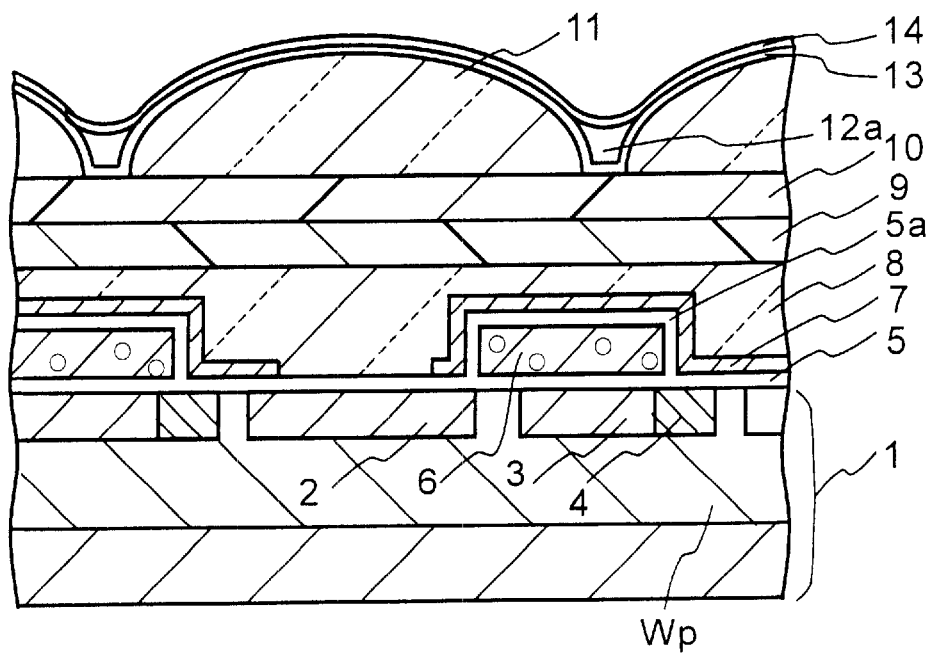

As shown in FIG. 3D, on the first asphericating film 12a is formed a second asphericating film 14 made of a photo resist film whose softening temperature is about 200 degrees Celsius and an average thickness is about 0.1 micrometer. The second asphericating film 14 is formed by applying photo-resist liquid and by being post baked at a temperature lower than the softening temperature of the second asphericating film 14.

For the second asphericating film 14, highly viscous photo-resist liquid is used to have a uniformed thickness over the surfaces of the wettability improving film 13 and the first asphericating film 12a.

Figure 3E:
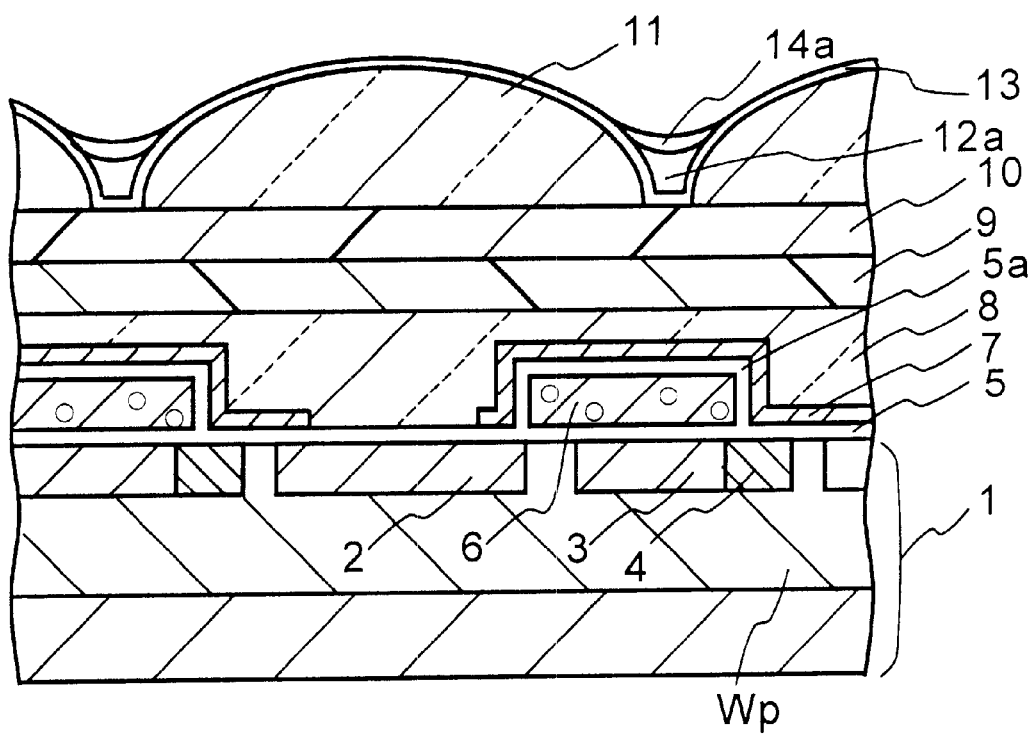

FIG. 3E is an enlarged cross sectional view of a part of the solid-state imaging device according to a modified example of the third embodiment of the invention. In the drawing, parts with the same reference numbers as in FIG. 6 and FIGS. 1A to 3D are basically same parts as in FIG. 6 and FIGS. 1A to 3D.

In this modified example, the second asphericating film 14 is heated over the softening temperature of 200 degrees Celsius to reflow. The reflowing makes the second asphericating film 14 into a second asphericating film 14a as shown in FIG. 3E.

Comparing to the third embodiment, micro lenses 11 according to this example are able to have longer focal length at the rim of the lenses. Also, by forming two asphericating films 12a and 14a, an aspheric lens having superior optical characteristics can be formed.

Further, the modified example of the third embodiment, as shown in FIG. 3E, may be formed by forming the second asphericating film 14 made of less viscous photo-resist liquid.

In that case, the second asphericating film 14 is formed by applying, on the surface of the first asphericating film 12a, less viscous photo-resist liquid that is added the increased amount of thinner to lower the viscosity. By using less viscous photo-resist liquid, the film thickness is not uniformed as shown in FIG. 3E.

Figure 4A:
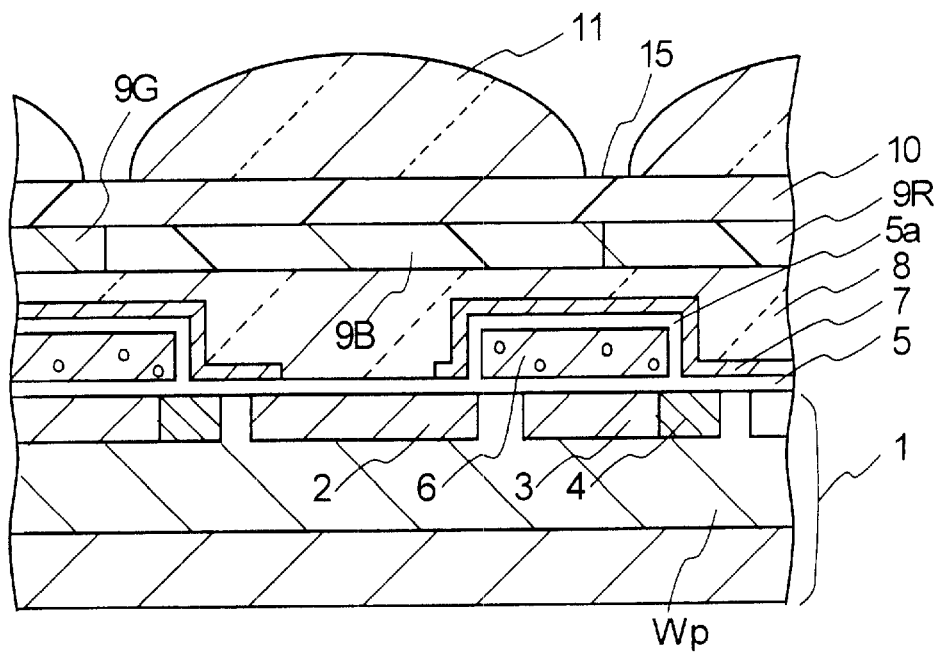
FIGS. 4A–4C are enlarged cross sectional views of a part of the solid-state imaging device according to a fourth embodiment of the invention.
Figure 4B:
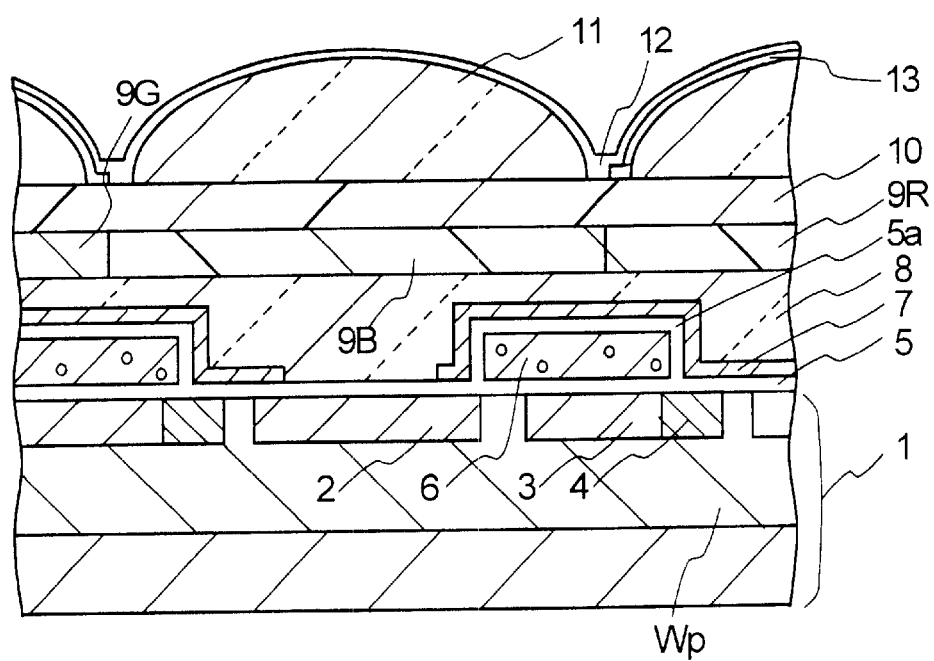
Figure 4C:
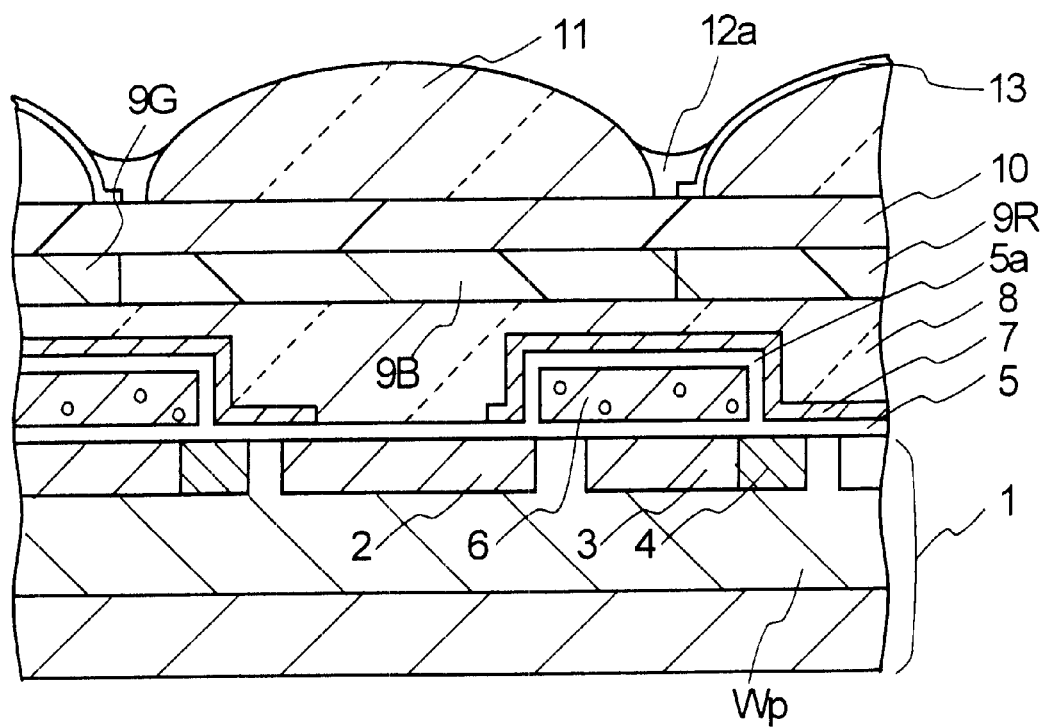

FIGS. 4A to 4C are enlarged cross sectional views of a part of the solid-state imaging device according to a fourth embodiment of the invention. In the drawings, parts with the same reference numbers as in FIG. 6 and FIGS. 1A to 3E are basically same parts as in FIG. 6 and FIGS. 1A to 3E.

By the same method as in the above described embodiments, on a substrate 1 are formed photoelectric conversion units 2, transfer channels 3, partition regions 4, insulating films 5, transfer electrodes 6, a light shielding film 7, a focus-adjusting layer 8, a color filter layer 9, and a planarizing layer 10.

Next, micro lenses 11 are formed on the planarizing layer 10. The micro lenses 11 are made of a photo resist film whose softening temperature is about 300 degree Celsius. The formed micro lenses have an average thickness of about 10 micrometer. At this point, a shape of the micro lenses 11 are like that shown in FIG. 4A.

On the micro lenses 11 is formed, by vapor phase reaction, evaporating or the like, a wettability improving film 13 made of a metal film which has an average thickness of about 10 nanometer. The metal film used for forming the wettability improving film 13 is effective for uniformalizing conditions of the surfaces of the micro lenses 11 and the space 15 between the micro lenses 11.

The wettability improving film 13 is partially removed by photo-resist process. In this embodiment, a portion of the wettability improving film 13 above each color filter layer 9B.

Next, on the micro lenses 11 and the remaining portion of the wettability improving film 13 is formed an asphericating film 12 made of a photo resist film whose softening temperature is about 200 degrees Celsius and an average thickness is about 0.2 micrometer, as shown in FIG. 4B.

The heating process is performed at over 20 degrees Celsius to fluidize the asphericating film 12, and an asphericating film 12a will be shaped as in FIG. 3C.

The metal film used for forming the wettability improving film 13 is effective for uniformalizing conditions of the surfaces of the micro lenses 11 and the space 15 between the micro lenses 11. Therefore, the wettability of the asphericating film 12 above the color filter layer 9B will be different from that of the asphericating film 12 above the color filter layers 9G and 9R.

In a micro lens above the color filter layer 9B, curvature at the rim is smaller than curvature at the axis, and focal length at the rim is larger than focal length at the axis. In micro lenses above the color filter layers 9G and 9R, curvature at the rims are larger than that in the micro lens above the color filter layer 9B. In this manner, micro lenses having different curvatures and focal lengths in accordance with color of the filter can be made. That is, it is possible to make micro lenses that can focus lights of various wavelengths into the same point.

According to this embodiment, it is possible to vary shapes of the micro lenses according to color of the color filters; therefore, incident light can be used further efficiently.

Figure 5:
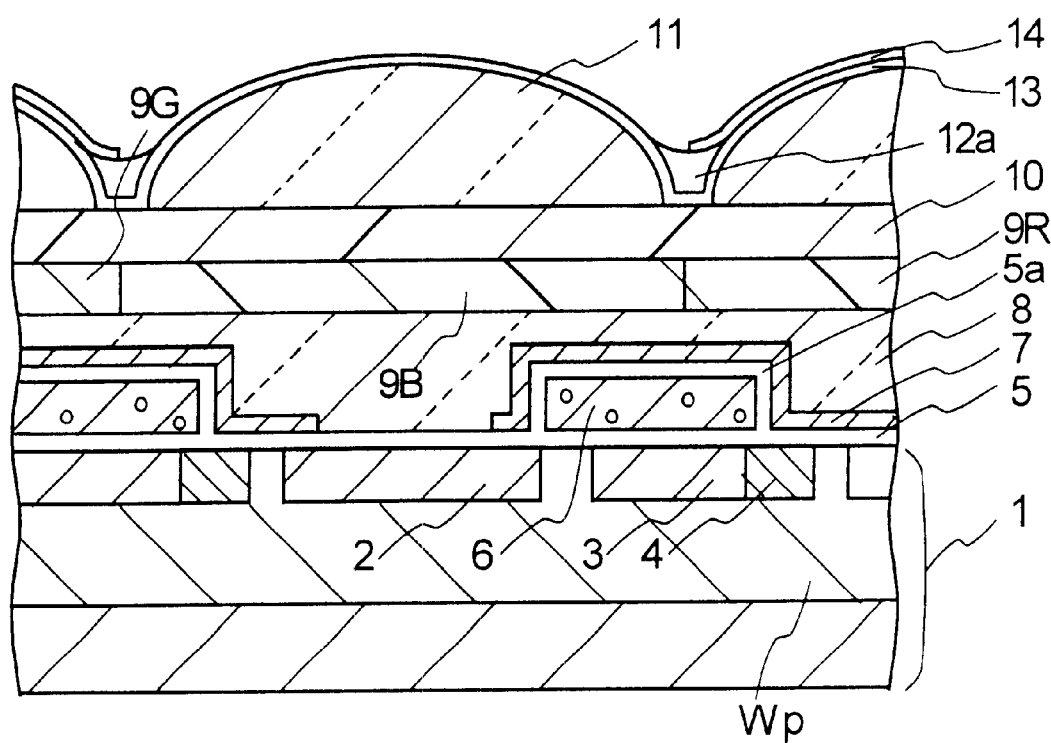
FIG. 5 is an enlarged cross sectional view of a part of the solid-state imaging device according to a fifth embodiment of the invention.

FIG. 5 is an enlarged cross sectional view of a part of the solid-state imaging device according to a fifth embodiment of the invention. In the drawing, parts with the same reference numbers as in FIG. 6 and FIGS. 1A to 4C are basically same parts as in FIG. 6 and FIGS. 1A to 4C.

By the same method as in the above described third embodiment, on a substrate 1 are formed photoelectric conversion units 2, transfer channels 3, partition regions 4, insulating films 5, transfer electrodes 6, a light shielding film 7, a focus-adjusting layer 8, a color filter layer 9, and a planarizing layer 10.

Next, micro lenses 11 are formed on the planarizing layer 10. The micro lenses 11 are made of a photo resist film whose softening temperature is about 300 degree Celsius. The formed micro lenses have an average thickness of about 1 micrometer. On the micro lenses 11 is formed, by vapor phase reaction, evaporating or the like, a wettability improving film 13 made of a metal film which has an average thickness of about 10 nanometer.

On the wettability improving film 13 formed a first asphericating film 12a made of a photo resist film whose softening temperature is about 250 degrees Celsius and an average thickness is about 0.1 micrometer. The first asphericating film 12a is formed by applying photo resist liquid to the surfaces of the wettability improving film 13. On the first asphericating film 12a is formed a second asphericating film 14 made of a photo resist film whose softening temperature is about 200 degrees Celsius and an average is thickness is about 0.1 micrometer. The second asphericating film 14 is formed by applying photo-resist liquid. By the above-described process, shapes of micro lenses are like those shown in FIG. 3D.

Then, the second asphericating film 14 is partially removed by photolithography process. In this embodiment, a portion of the second asphericating film 14 above each color filter layer 9B is removed as shown in FIG. 5. After that, if necessary, heating is performed at 200 degrees Celsius.

Removing a portion of the asphericating film 14 as described above can attain the same effect as said in the fourth embodiment.

In the above described fourth and fifth embodiments are described methods for differentiating aspheric characteristics of micro lenses above the color filter layers 9B form those above the color filter layers 9G and 9R. The invention is not limited only to the above embodiments. It is possible to differentiate aspheric characteristics of micro lenses above the color filter layers 9R form those above the color filter layers 9G and 9B, or above the color filter layers 9G form those above the color filter layers 9B and 9R. Further, it is possible to differentiate aspheric characteristic of every micro lens from each another according to the color of the color filter layers 9.

In the above-described embodiments, the micro lenses 11 before softening process have a thickness of about 1 micrometer, and the asphericating film 12 has a thickness of about 0.2 micrometer. This invention is not limited by those thicknesses, and the thickness of those can be modified according to the specification of a solid state-imaging device.

The present invention has been described in connection with the preferred embodiments. The invention is not limited only to the above embodiments. It is apparent that various modifications, improvements, combinations, and the like can be made by those skilled in the art.

What is claimed is:

1. A solid-state imaging device comprising:
   a semiconductor substrate which demarcates a two-dimensional surface;
   a multiplicity of photoelectric conversion units configured in a multiplicity of rows and columns on the surface of said semiconductor substrate;
   a light shielding film having openings formed above said semiconductor substrate, each of the openings is formed on each of said photoelectric conversion unit;
   a planarizing insulating film formed on said light shielding film;
   micro lenses formed on said planarizing insulating film, each micro lens is formed just above each of said opening; and
   a modifying film having one layer or a plurality of layers formed directly on said micro lenses and having a top surface with different curvature from that of a top surface of the micro lenses.

2. A solid-state imaging device according to claim 1, wherein softening temperature of said modifying film is lower than softening temperature of said micro lenses, and
   said modifying film is softened once or a plurality of times at temperature lower than temperature by heating performed to form said micro lenses.

3. A solid-state imaging device according to claim 1, further comprising color filters in a plurality of colors formed between said planarizing insulating layer and said micro lenses, wherein part of said modifying film is removed at every micro lens according to color of said color filters.

4. A solid-state imaging device according to claim 1, wherein thickness of said modifying film is getting thicker from an axis of said micro lens to a rim of said micro lens.

5. A solid-state imaging device according to claim 1, wherein each of said micro lenses cooperates with said modifying film to form an aspheric lens, and at least a part of rim of said aspheric lens has lower curvature than an axis of said aspheric lens has.

6. A solid-state imaging device according to claim 1, wherein each of said micro lenses cooperates with said modifying film to form an aspheric lens, and rim of said aspheric lens has lower curvature than an axis of said aspheric lens has.

7. A solid-state imaging device according to claim 1, wherein each of said micro lenses cooperates with said modifying film to form an aspheric lens, and rim of said aspheric lens has longer effective focal length than an axis of said aspheric lens has.

8. A solid-state imaging device according to claim 1, further comprising a wettability improving film formed on said semiconductor substrate covering said micro lenses to uniformalize surface conditions on and between said micro lenses.

* * * * *